United States Patent [19]

Woodworth

[11] 4,441,079
[45] Apr. 3, 1984

[54] MULTIPLE BANDWIDTH FM DEMODULATOR

[75] Inventor: Donald J. Woodworth, Ocala, Fla.
[73] Assignee: Microdyne Corporation, Ocala, Fla.
[21] Appl. No.: 311,111
[22] Filed: Oct. 13, 1981
[51] Int. Cl.³ .............................................. H03D 3/06
[52] U.S. Cl. .................................... 329/131; 329/137
[58] Field of Search ............... 329/103, 110, 117, 118, 329/136, 137, 138, 131; 455/214, 337

[56] References Cited

U.S. PATENT DOCUMENTS 4,066,972  1/1978  Ishigaki et al. ................. 329/136 X Primary Examiner—Siegfried H. Grimm
Attorney, Agent, or Firm—Howard L. Rose; William D. Hall

[57] ABSTRACT

A multiple bandwidth quadrature type FM demodulator employs a double-balanced mixer supplied with a frequency modulated IF signal directly and through one of a selectable plurality of bandpass circuits each having a different bandwidth, having a linear phase shift versus frequency characteristic and producing a 90° phase shift at the IF frequency whereby to produce at the output of the mixer a signal level that varies as a linear function of frequency of the input signal, the demodulator including a bias control circuit for the mixer to establish a normalized output for all filters at full bandwidth modulation and further including circuits for establishing a signal balanced with respect to ground or other reference potential regardless of the filter employed.

7 Claims, 4 Drawing Figures

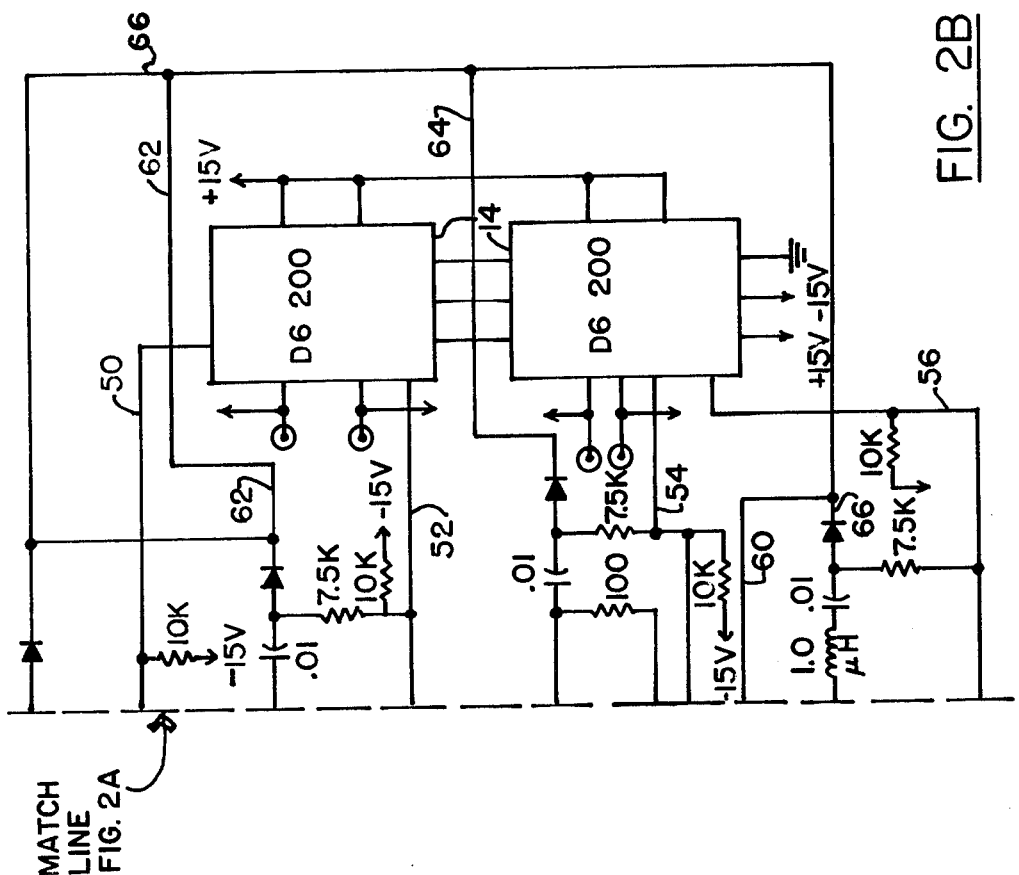

MULTIPLE BANDWIDTH FM DEMODULATOR

BACKGROUND OF THE INVENTION

The present invention relates to FM demodulators and more particularly to a quadrature type FM demodulator which may be utilized with a plurality of different bandpass filters selected in accordance with the bandpass of a receiver with which the demodulator is to be employed.

Usually, quadrature FM demodulators employ a limiter to provide one signal to a double-balanced demodulator mixer and provide a quadrature signal by loosely coupling to a single tuned circuit also driven by the limiter. Such an arrangement is restricted to relatively narrow frequency bands in use, for instance, in the FM sound carrier of a TV signal. The system is restricted to use with a single bandwidth and cannot be accommodated to variable bandwidth systems.

Another method of obtaining the quadrature signal is to use a delay line, but again, the delay line is operative only at a single frequency.

It is an object of the present invention to provide a quadrature type FM detector for use with various bandwidth circuits and specifically, to provide a quadrature type FM demodulator having circuitry which is common to all bandwidths at which the demodulator can operate except the specific bandwidth determining circuits, such circuits comprising a plurality of filters individually switched into the circuit with each providing an exact 90° phase shift therethrough at the FM carrier frequency and providing a linear frequency to phase shift function through each of the filters whereby there is produced at the output of the demodulator, a d.c. signal which varies as a function of the FM modulation, and further, to provide a separate d.c. gain control for the double-balanced mixer each for insertion in the circuit in conjunction with a different filter whereby to provide the same zero signal d.c. level on the output of the mixer regardless of the filter employed for each bandwidth.

More specifically, the present invention provides a limiter-driver for providing FM signals, with the AM substantially removed, to a signal splitter wherein one output of the splitter is provided as an input to a double-balanced mixer. The second signal from the splitter is provided to a bank of bandpass filters each having a different bandpass characteristic. Each filter has a bandpass characteristic which is compatible with a selectable bandpass characteristic of the receiver or other equipment with which the FM demodulator is to be employed. At the carrier frequency of the FM carrier, the phase shift through each filter is 90°, as previously indicated, and as the frequency varies with signal, the phase shift through the filter varies linearly above and below the 90° shift. The output signal from the selected filter is applied to the double-balanced mixer which produces a determinable d.c. level at its output as a function of the delay of the signal through the selected bandpass filter. Thus, as the frequency of the signal rises above carrier frequency, the phase shift through the filter increases and as the frequency falls below the carrier frequency, the phase shift decreases. In consequence, as frequency rises, the d.c. level at the output of the double-balanced mixer rises; as the frequency falls, the output of the double-balanced mixer falls. Since the filters are such that the shift at the carrier frequency is 90° through each filter and the frequency-phase relationship is linear for all four filters, the FM signal is converted to a phase modulated signal that is readily detected by the double-balanced mixer. Thus, a single driver circuit for the filters and the demodulator and output circuits may be common for all filters having the characteristics as defined above.

Characteristics of the filters other than the frequency-phase shift characteristics are somewhat different and the d.c. level of the output signal from the modulator is not the same for each filter unless steps are taken to change the gain of the mixer for each filter selected. In accordance with a further feature of the invention, the resistance value in bias circuit of the mixer is changed in accordance with each filter characteristic so that the d.c. gain level of the mixer for each filter is normalized for the respective bandwidth deviations. The output level from the demodulator is not balanced relative to ground, but rides at a potential above ground which may be somewhat substantial. In the specific circuits employed in the present invention, the offset above ground is about 9 volts but varies somewhat with the particular filter employed. In accordance with a further feature of the present invention, a variable offset control is provided to the output from one leg of the balanced output from the mixer to permit precise individual control of offset correction for each filter.

DESCRIPTION OF THE FIGURES

FIGS. 2A–2C together form a circuit diagram of the circuits employed in the realization of the system of the present invention.

DETAILED DESCRIPTION OF THE PREFERRED EMBODIMENT

Figure 1:
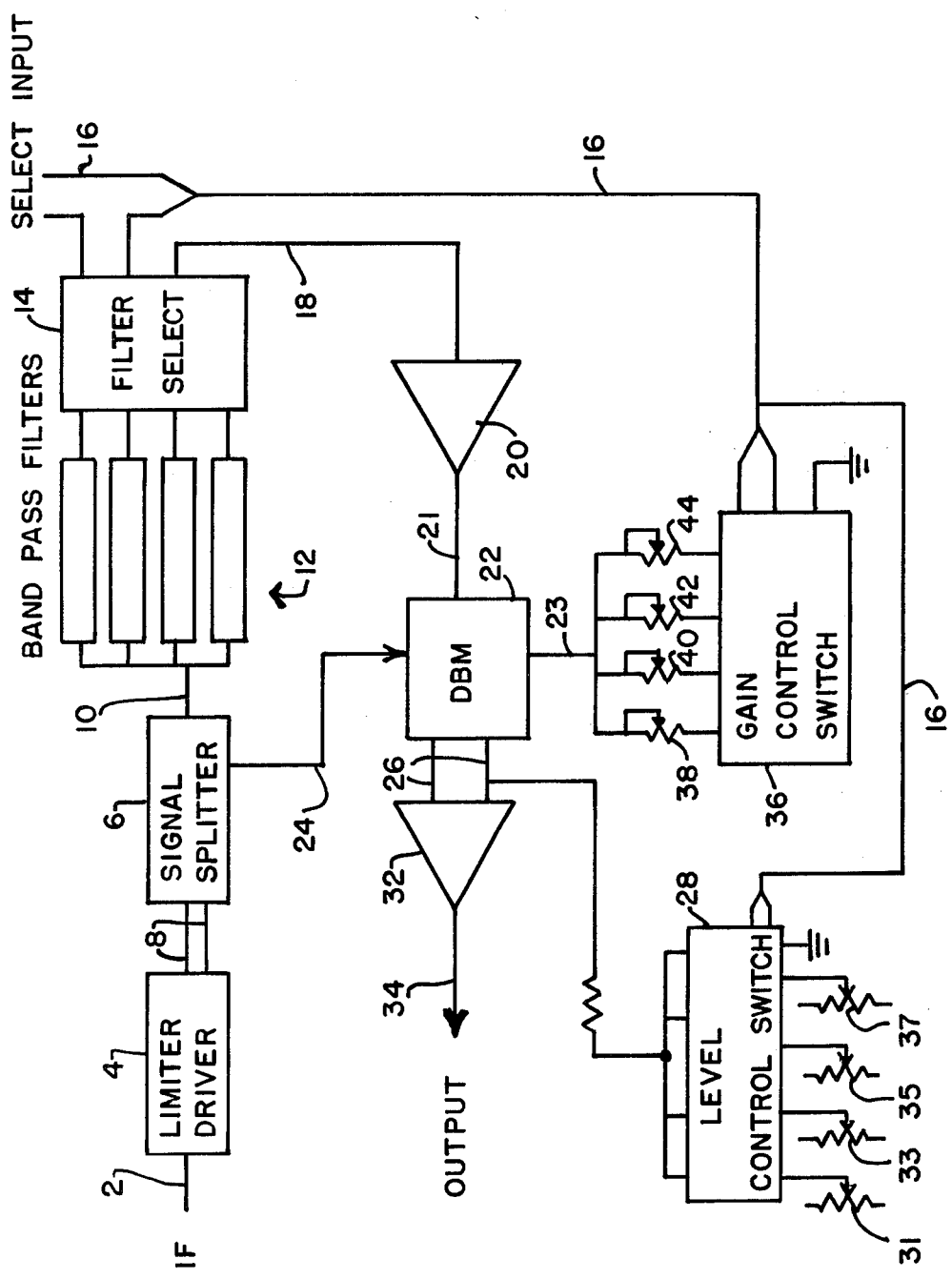
FIG. 1 is a block diagram of the circuits of the present invention.

Referring now specifically to FIG. 1 of the accompanying drawings, there is illustrated a block diagram of the FM demodulator of the present invention. An IF signal having the frequency modulated information thereon is applied via a lead 2 to a limiter driver 4 which supplies an amplified signal to a signal splitter 6 via leads 8. The output of the signal splitter 6 is supplied via a lead 10 to a plurality of bandpass filters generally designated by the reference numeral 12, the particular filter being employed at any given time being selected by filter select circuit 14.

The receiver with which the present demodulator has been particularly designed to cooperate is microprocessor controlled and selection of the bandwidth of the FM demodulator is made by the microprocessor via a data buss 16 applied to the filter select circuit 14 and to other circuits in the demodulator as is discussed subsequently.

The output from the selected bandpass filter appears on a lead 18 and is applied through a driver 20 to a double-balanced mixer 22, a Motorola MC1496. The other signal provided by the signal splitter 6 is also supplied to the double-balanced mixer 22 via a lead 24. The filters 12 are designed such that a 90° phase shift occurs through each and every one of the filters 12 at the center frequency of the FM carrier. Any deviation upward or downward from such frequency changes the phase shift through the filter as a function of frequency thereby converting the signal from a frequency modulated signal to a phase modulated signal. The phase modulated signal is applied to the double-balanced mixer 22 where it is compared with the unshifted signal of the same frequency appearing on lead 24. If the IF signal bears no modulation, then the signals appearing on leads 21 and 24 are in phase quadrature and the level of the d.c. signal appearing on output leads 26 of the mixer 22 is at a specific value which is a function of the filter and is different for each filter unless compensation is provided to produce the same d.c. signal for all filters. If the carrier is modulated, the d.c. signal varies above or below such value as a function of the frequency modulation on the carrier. Specifically, each of the filters 12 has a linear phase-to-frequency characteristic. As the frequency of the incoming signal increases, the phase shift between the signals rises above 90° and the level of the differential d.c. signal on the leads 26 rises above the quadrature d.c. level. As the frequency of the modulation on the IF carrier decreases, the phase shift decreases and the differential d.c. level on the leads 26 decreases. Thus, the double-balanced mixer has served as a quadrature phase detector in a conventional sense.

The unmodulated signal, d.c. level on the leads 26 is balanced out by means of a level control circuit including a switch 28 which establishes one of four different voltage levels on lower lead 26 as a function of the specific filter 12 selected by the filter select circuit 14. It will be noted that the same data code applied to the filter select circuit 14 is also applied to the level control switch 28 to switch in an appropriate value of resistor 31, 33, 35 or 37 so that the proper correlation between the control level and the filter 12 is achieved. The signal on leads 26 is applied to a differential amplifier 32 to provide an output signal on a lead 34 that is balanced about zero. The differential amplifier is required since the output from the double-balanced mixer in the particular arrangement of the present invention is offset about 9 volts from ground at zero modulation.

The gain of the double-balanced mixer 22, in order to be rendered appropriate for each of the bandpass filter 12, is selected by means of a gain control switch 36 also controlled from the data input lead 16 so that an appropriate resistance is selected to control the gain of the double-balanced mixer. The resistor selected by the gain control switch 36 is one of four resistors 38, 40, 42, 44, each being independently variable to provide precise trimming of gain; the resistors constituting potentiometers.

It can be seen from the above that there has been provided an FM demodulator in accordance with the present invention that uses common circuitry for all bandwidths of the FM modulator except the specific bandpass filter. Thus, great economy of circuitry has been achieved in an FM demodulator that may be employed for multiple different bandwidths of a receiver having variable bandwidth operation. The invention obviously is not limited specifically to four such filters, four filters being illustrated since in the actual realization of the circuit, four filters were employed.

Figure 2A:
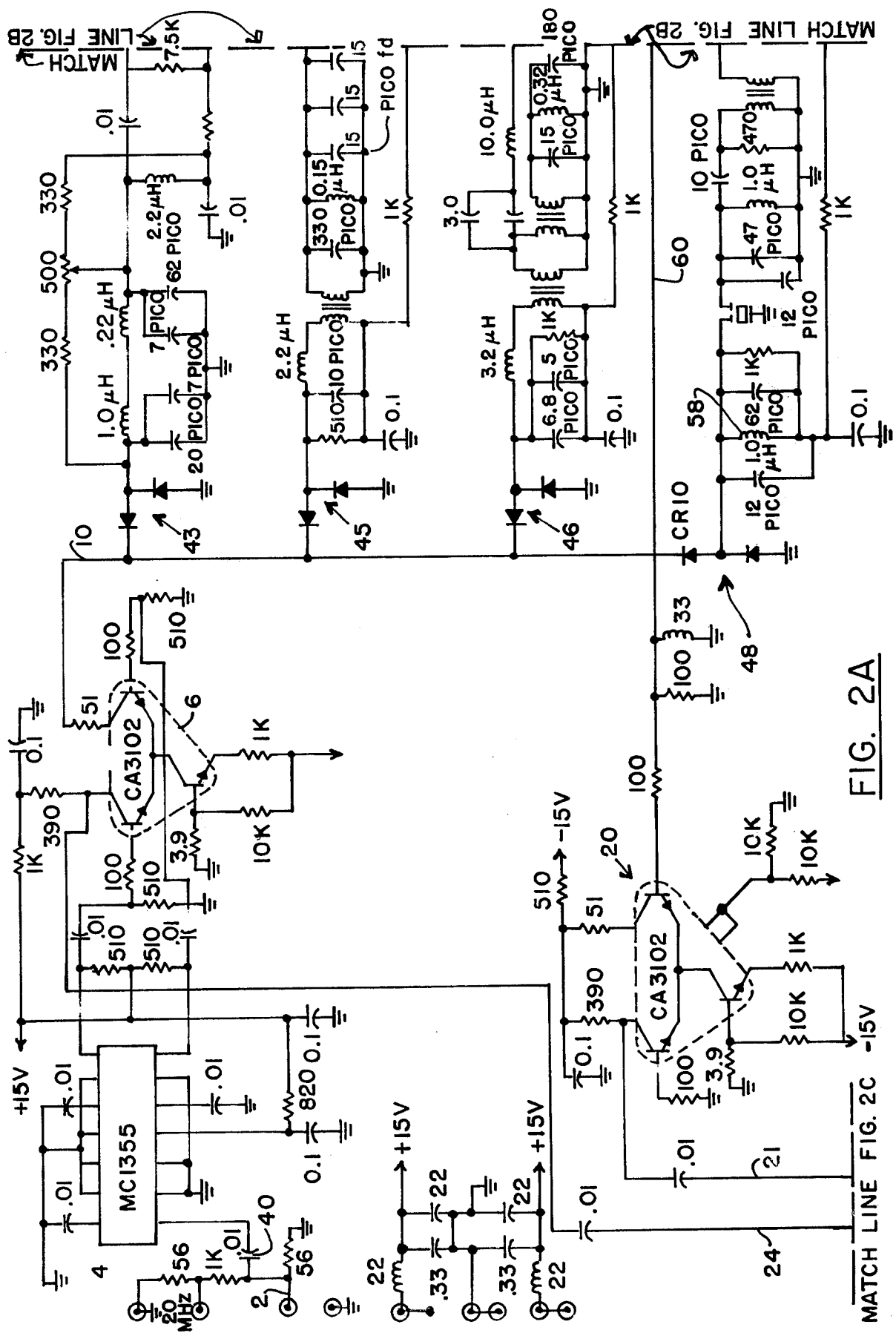
Figure 2C:
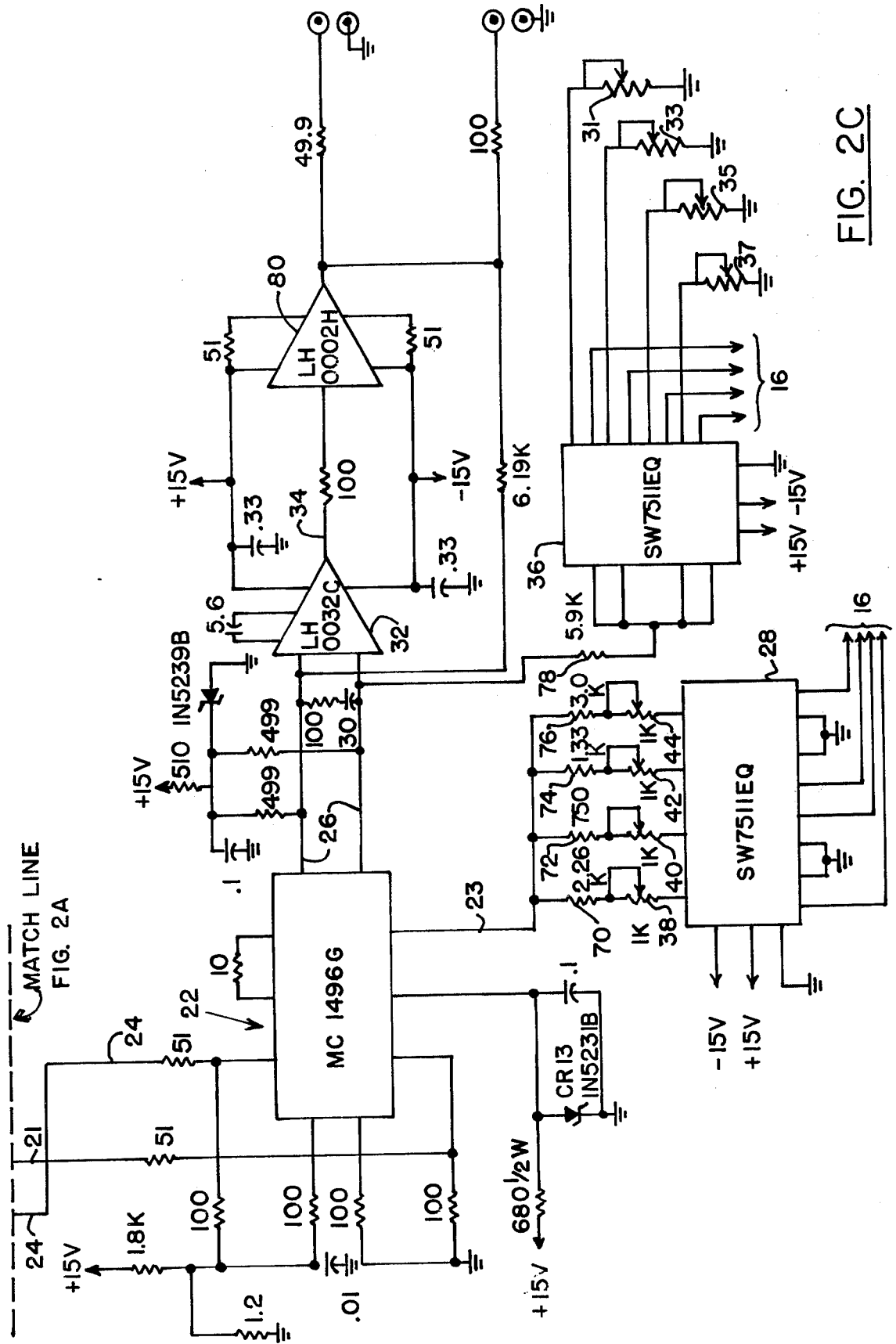

Reference is now made to FIGS. 2A–2C of the accompanying drawings for a detailed circuit diagram of the demodulator of FIG. 1. The IF signal appearing on lead 2 is applied through a capacitor 40 to pin 14 of a Motorola MC1355 constituting the limiter and IF driver 4 as it appears in FIG. 1. The output of the limiter-driver appears on pins 7 and 8 of the MC1355 and is applied differentially to pins 8 and 11 of a CA3102 constituting the signal splitter 6 of FIG. 1. The lead 10 applies a signal to four pin diode switching circuits 43, 45, 46 and 48 employed to select the specific one of the filters 12 which is to be utilized in the circuit at any given time. The pin diodes are normally biased in a blocking condition by means of signals appearing on leads 50, 52, 54 and 56 of filter select circuit 14 comprising two selection circuits DG-200. As previously indicated, the DG-200s are controlled by the microprocessor of the present invention in accordance with signals received from the microprocessor control of the receiver with which the demodulator is to be utilized. Manual control of the DG-200s is also obviously possible.

Selection of a particular set of pin diodes is effected by applying a positive d.c. voltage to the lead associated with the filter to be utilized. For instance, if it is desired to select the pin diodes constituting a part of the selection circuit 48 associated with the lowestmost filter 12 of FIGS. 2A–2C, a positive voltage appears on the lead 56 and is applied through the choke 58 to the junction of the two pin diodes of the pair of the pin diodes constituting switch 48 so the signal appearing on the lead 10 is routed through the lowermost filter. The other pin diode switches 43, 44 and 46 have negative voltages applied to their control leads 50, 52 and 54 so that the diodes to ground are turned on thereby shunting the filter inputs to ground and effectively back biasing the diodes connecting the filters to lead 10. If the uppermost filter 12 is selected, the signal passed therethrough appears on a lead 66 to which output leads 62 and 64 of the intermediate filters and output lead 60 of the lowermost filter are connected. As previously indicated, the phase shift through each of the filters 12 is precisely 90° at exact quadrature of the signal on the lead 60 relative to the signal on the lead 24 of both FIGS. 1 and 2A–2C. The signal on the lead 24 is derived from pin 7 of the signal splitter 6, the signal on the lead 10 being derived from the pin 6 of the signal splitter 6.

The signal on the lead 60 is applied through the amplifier 20 and thence to double-balanced mixer 22 which is a Motorola MC1496G. The signal on lead 21 is applied to pin 4 of the double-balanced mixer 22 while the shifted signal appearing on the lead 24 is applied to pin 7 of the double-balanced mixer. Output signals from the double-balanced mixer appears on pins 6 and 9 of the mixer and are applied via leads 26 to the differential amplifier 32. It should be noted that the pin 5 of the double-balanced mixer is connected via a lead 23 to potentiometers 38, 40, 42, and 44 through resistors 70, 72, 74 and 76, respectively. Potentiometers 38, 40, 42, and 44 are connected to pins 16, 14, 12, and 10, respectively, of a selector switch or level control switch 28, control of which is supplied via leads 16 to determine which of the potentiometers and associated resistors are to be connected in the bias control circuit of the mixer 22, the bias control circuit being associated with the pin 5 of the demodulator integrated circuit.

The application notes for the MC1496 characterize the current from the pin 5 and through associated resistor at about 1 milliamp. It has been found that this current may range between 1 and 5 milliamps and that by selecting specific values of resistors to provide specific currents, the gain of the balanced demodulator may be adjusted to provide conformance of the gain control characteristic with the characteristic of a selected filter 12. The potentiometers 38, 40, 42 and 44, in effect, provide a vernier to permit precise levels of gain to be set for the demodulator for each filter selected.

As previously indicated, the differential amplifier 32 is utilized to balance the signal output from the demodulator about ground. The output of the demodulator is nominally 9 volts above ground, and it is desired to provide an output signal on lead 34 which is balanced relative to ground. This function is accomplished primarily by the differential amplifier 32 in conjunction with the level control switch 36. Normally, the pin 6 of National Semi-Conductor LH0032C is connected through a 5.9 K resistor 78 to ground. In the present invention, precise control of zero balance is achieved by the use of the potentiometers 31, 33, 35 and 37 only one of which is selected at a time by the level control switch 36. The resistance card of each of the potentiometers is connected between a plus and minus voltage such that when the slider of the potentiometer is positioned at about the middle of the resistance card, a zero voltage is developed at the associated pins 9, 11, 13 and 15 respectively of the switch 36. Movement of the slider above or below the center point applies a small positive or negative voltage respectively to the lead 6 to provide precise balance at ground for the signal appearing on the output lead 34. The output of the differential amplifier 32 is applied to a further amplifier 80 to provide the necessary drive voltage for additional circuits of the receiver which form no part of the present invention.

Once given the above disclosure, many other features, modifications and improvements will become apparent to the skilled artisan. Such other modifications, features and improvements are, therefore, considered a part of this invention, the scope of which is to be determined by the following claims.

I claim:

1. A selectable bandwidth detector for frequency modulated signals comprising,
   a signal splitter for deriving a pair of signals from an input signal,
   a double-balanced mixer,
   a plurality of filters each having a different bandwidth from each other filter,
   each said filter having a 90° phase shift therethrough at the carrier frequency of the frequency modulated signals and having a linear phase shift-frequency characteristic,
   means for applying one of said pair of signals through a selected one of said filters to said double-balanced mixer,
   means for applying the other of said pair of signals to said double-balanced mixer, and
   means for selecting the one of said filters to be inserted between said signal splitter and said double-balanced mixer.

2. The system according to claim 1 further comprising,
   means for controlling the gain of said double-balanced mixer.

3. The system according to claims 1 or 2 further comprising,
   a differential amplifier, means for applying a differential output signal from said double-balanced mixer to said differential amplifier, and
   means for controlling the balance of the output signal from said differential amplifier relative to a reference potential.

4. The system according to claim 1 wherein said double-balanced mixer includes,
   a bias circuit,
   a plurality of resistors,
   means for selectively inserting one of said plurality of resistors into said bias circuit as a function of the selected one of said filters.

5. The system according to claim 1 or 4 wherein,
   said double-balanced mixer has a differential output circuit,
   a differential amplifier, means for applying the differential signal derived from said differential output circuit to said differential amplifier, and
   means connected to an input of said differential amplifier for balancing the output signal of said differential amplifier relative to a reference potential.

6. The system according to claim 5 wherein said means for balancing comprises,
   a plurality of resistors, and
   means for selectively connecting one of said plurality of resistors to said input as a function of the bandwidth of the selected one of said filters.

7. The method of using a single double-balanced mixer as a detector of frequency modulated signals for a receiver of various different bandwidths of signals comprising the steps of
   selecting a filter appropriate to the desired bandwidth of a received signal from a plurality of filters all having linear phase frequency characteristics and all producing a 90° phase shift at the frequency of the carrier of the frequency modulated signal,
   applying signals passed through the selected filter to one input circuit of a double-balanced mixer, and
   applying the signal applied to the selected filter to another input of the double-balanced mixer.

* * * * *